(12) United States Patent
Grodzki (10) Patent No.: US 9,008,400 B2
(45) Date of Patent: Apr. 14, 2015

(54) METHOD AND APPARATUS FOR CORRECTION OF ARTIFACTS IN MAGNETIC RESONANCE IMAGES

(71) Applicant: David Grodzki, Erlangen (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 17 days.

(21) Appl. No.: 14/036,232

(22) Filed: Sep. 25, 2013

(65) Prior Publication Data

US 2014/0086468 A1  Mar. 27, 2014

(30) Foreign Application Priority Data

Sep. 25, 2012 (DE) .......................... 10 2012 217 287

(51) Int. Cl.
G06K 9/00 (2006.01)
G01R 33/565 (2006.01)
G01R 33/48 (2006.01)
G01R 33/483 (2006.01)

(52) U.S. Cl.
CPC ........ G01R 33/56572 (2013.01); G01R 33/565 (2013.01); G01R 33/4816 (2013.01); G01R 33/4833 (2013.01); G01R 33/5659 (2013.01)

(58) Field of Classification Search
CPC ............ G01R 33/5616; G01R 33/565; G01R 33/56572
USPC ........................................................ 382/131
See application file for complete search history.

(56) References Cited

U.S. PATENT DOCUMENTS

| | | | | |
|---|---|---|---|---|
| 2005/0001619 A1* | 1/2005 | Kiefer | ........................... | 324/309 |
| 2008/0021304 A1* | 1/2008 | Stemmer | ........................ | 600/410 |
| 2010/0244827 A1* | 9/2010 | Hennel | .......................... | 324/309 |
| 2011/0105884 A1* | 5/2011 | Beck | ............................. | 600/410 |
| 2013/0101198 A1 | 4/2013 | Grodzki et al. | | |

OTHER PUBLICATIONS

Nielles-Vallespin et al., "3D Radial Projection Technique With Ultrashort Echo Times for Sodium MRI: Clinical Applications in Human Brain and Skeletal Muscle", Magnetic Resonance in Medicine, vol. 57 (2007) pp. 74-81.

Grodzki et al., "Ultra Short Echo Time imaging Using Pointwise Encoding Time Reduction with Radial Acquisition (PETRA)", Proc. Intl. Soc. Mag. Reson. Med., vol. 19 (2011) p. 2815.

(Continued)

*Primary Examiner* — Amir Alavi
*Assistant Examiner* — Kenny Cese
(74) *Attorney, Agent, or Firm* — Schiff Hardin LLP (57) ABSTRACT

In a method for the calculation of individual elements of a matrix to correct artifacts in magnetic resonance images that are reconstructed from measurement data acquired using an MR pulse sequence, in which gradients are switched simultaneously during the radiation of at least one non-selective excitation pulse, at least one excitation profile of an excitation pulse used to acquire measurement data is loaded into a process, the profile depending on the measured location x and the measured k-space point k and the gradient strength applied in the measurement. From each loaded excitation profile, an element of a transposed, inverted disturbance matrix is calculated which corresponds to the location x and the measured k-space point k. Instead of a Fourier back-transformation, matrix inversion is used for the image reconstruction of a corrected image.

8 Claims, 3 Drawing Sheets

(56) References Cited

OTHER PUBLICATIONS

Weiger et al., "MRI with Zero Echo Time: Hard Versus Sweep Pulse Excitation", Magnetic Resonance in Medicine, vol. 66 (2011) pp. 379-389.

Grodzki et al., "Correcting Slice Selectivity in Hard Pulse Sequences", Journal of Magnetic Resonance vol. 214 (2011) pp. 61-67.

* cited by examiner

METHOD AND APPARATUS FOR CORRECTION OF ARTIFACTS IN MAGNETIC RESONANCE IMAGES

BACKGROUND OF THE INVENTION

1. Field of the Invention

The present invention concerns: a method to calculate individual elements of a matrix to correct artifacts in magnetic resonance images that are created by means of an MR pulse sequence in which gradients are activated simultaneously during the radiation of at least one excitation pulse, as well as a magnetic resonance system and an electronically readable data medium for implementing such a method.

2. Description of the Prior Art

Magnetic resonance (MR) (also known as magnetic resonance tomography), is a known modality with which images of the inside of an examination subject can be generated. Expressed in a simplified form, the examination subject is positioned in a strong, static, homogeneous basic magnetic field (also called a $B_0$ field) with a field strength from 0.2 Tesla to 7 Tesla or more in a magnetic resonance apparatus, such that the nuclear spins of the examination subject orient along the basic magnetic field. To trigger magnetic resonance signals, radio-frequency excitation pulses (RF pulses) are radiated into the examination subject, and the triggered magnetic resonance signals are measured as k-space data, on the basis of which MR images are reconstructed or spectroscopy data are determined. For spatial coding of the measurement data, rapidly switched magnetic gradient fields are superimposed on the basic magnetic field. The acquired measurement data are digitized and stored as complex numerical values in a k-space matrix. An associated MR image can be reconstructed from the k-space matrix populated with values, such as by means of a multidimensional Fourier transformation.

Sequences with very short echo times TE—for instance TE less than 0.5 milliseconds—offer new fields of application for magnetic resonance tomography. They enable the depiction of substances that cannot be depicted with conventional sequences such as (T)SE ((Turbo) Spin Echo) or GRE (gradient echo) since their respective decay time of the transversal magnetization M2 is markedly shorter than the possible echo times of the conventional sequences, and their signal has therefore already decayed at the point in time of acquisition. In contrast, with echo times in the range of these decay times it is possible to depict the signals of these substances in an MR image, for example. The decay times T2 of teeth, bones or ice lie between 30 and 80 microseconds, for example.

The application of sequences with ultrashort echo times (UEZ sequences) thus enables (for example) bone and/or dental imaging and/or the depiction of cryoablations by means of MR, and is usable for MR-PET (combination of MR and positron emission tomography, PET) or PET attenuation correction.

Examples of UEZ sequences are: UTE ("Ultrashort Echo Time"), for example as described in the article by Sonia Nielles-Vallespin, "3D radial projection technique with ultrashort echo times for sodium MRI: Clinical applications in human brain and skeletal muscle", Magn. Res. Med. 2007, 57, Pages 74-81; PETRA ("Pointwise Encoding Time reduction with Radial Acquisition") as described by Grodzki et al. in "Ultra short Echo Time Imaging using Pointwise Encoding Time reduction with Radial Acquisition (PETRA)", Proc. Intl. Soc. Mag. Reson. Med. 19 (2011), Page 2815; or z-TE as described by Weiger et al. in "MRI with zero echo time: hard versus sweep pulse excitation", Magn. Reson. Med. 66 (2011), Pages 379-389.

In these sequences, usually a hard delta pulse is applied as a radio-frequency excitation pulse and the data acquisition is subsequently begun. In PETRA or z-TE, the gradients are already activated during the excitation. The spectral profile of the excitation pulse hereby corresponds approximately to a sin c function. If the pulse bandwidth is insufficient or the gradients are too strong, the outer image regions are no longer sufficiently excited. In the reconstructed MR image, this incorrect excitation has the effect of causing blurring artifacts at the image edge, which are more strongly pronounced the stronger the gradients that are switched during the excitation.

An insufficient excitation thus leads to artifact-plagued MR images. This problem has previously for the most part been negligible. At most, it is sought to optimally reduce the strength of the gradients. However, imaging-relevant variables (such as the readout bandwidth, the repetition time TR and the contrast of the image) are changed as a result of this gradient field strength reduction. For example, a reduction of the gradient strength increases the minimum necessary repetition time TR, and therefore also the total measurement time. Such artifacts could furthermore be reduced by choosing the excitation pulses to be particularly short, in order to increase the excitation width. However, the maximum possible flip angle and the precision of the actual emitted RF excitation pulse are simultaneously reduced in proportion to the duration of the RF excitation pulse. For example, for a duration of the excitation pulse of 14 microseconds, the maximum flip angle is approximately 9°, and for a reduced duration of the excitation pulse to 7 microseconds, the maximum flip angle would be only approximately 4.5°. Therefore, this procedure is also not usable without limitation and incurs a degradation of the image quality.

SUMMARY OF THE INVENTION

An object of the invention is to provide a method to calculate individual elements of a matrix in order to correct artifacts in magnetic resonance images with only a small amount of computing time, a method to correct artifacts in magnetic resonance images that result from an MR pulse sequence in which gradients are switched simultaneously during the radiation of at least one non-selective excitation pulse, and a magnetic resonance system and an electronically readable data medium that allow a reduction of artifacts in MR measurements with gradients switched during the excitation without limiting the MR measurement.

A method according to the invention for the calculation of individual elements of a matrix to correct artifacts in magnetic resonance images that were acquired by means of an MR pulse sequence, in which gradients are switched simultaneously during the radiation of at least one non-selective excitation pulse, includes the following steps.

At least one excitation profile of an excitation pulse used to acquire measurement data is provided to a processor, the profile depending on the measured location x and the measured k-space point k and the gradient strength applied in the measurement.

From each excitation profile, the processor is configured to calculate an element of a transposed, inverted disturbance matrix that corresponds to the location x and the measured k-space point k.

The direct calculation according to the invention of individual elements of a transposed, inverted disturbance matrix requires only a small computation cost and can thus be executed quickly and simply. The symmetries that are present due to the acquisition of the measurement data by means of an MR pulse sequence in which gradients are switched simultaneously during the radiation of at least one non-selective excitation pulse are thereby cleverly utilized. The elements of a matrix for correction of the ultimately acquired MR images, which elements are associated with measurement data acquired along trajectories that do not proceed symmetrically with regard to the k-space center, can also be calculated in this way. An interpolation that is often plagued with errors can be omitted.

The elements of the matrix for correction that are calculated according to the invention are used in order to correct artifacts in magnetic resonance images which have been acquired by means of an MR pulse sequence in which gradients are switched simultaneously during the radiation of at least one non-selective excitation pulse. Such a method for correction includes the steps of loading measurement data acquired with the pulse sequence in k-space into a processor, calculating a corrected image from the acquired measurement data in k-space and the associated elements of the transposed, inverted disturbance matrix, which elements are calculated according to a method according to the invention, and displaying and/or storing the corrected image.

By the calculation of elements of a transposed, inverted disturbance matrix on the basis of the location to be measured, the read-out k-space points and the gradients applied during the excitation, the distorting influence of a non-uniform, incorrect excitation can be remedied in a simple manner. The image quality, primarily in the outer regions of the reconstructed image, can thus be markedly improved. In particular, a high homogeneity in the image and a sharp contrast can be achieved without artifacts. The strength of the applied gradients is hereby subject to no limitations by the method according to the invention. This means that stronger gradients can also be switched without needing to accept losses in the image quality. Longer-lasting excitation pulses (and therefore higher flip angles) can likewise also be used via the method according to the invention without negatively affecting the image quality.

The invention is based on the following considerations.

In measurements (data acquisitions) with gradients switched during the excitation, the excited region changes with every repetition because different gradient configurations are switched in each repetition. This leads to disturbances since—for example given a repetition with a gradient configuration of Gx=0 and Gy=G—an image resulting from this measurement point is superimposed (corresponding to the incorrect excitation) with a sin c function which is symmetrical in the y-direction, in contrast to which—given a repetition with a gradient configuration of Gx=G and Gy=0, for example—an image resulting from this measurement point is superimposed (corresponding to the incorrect excitation) with a sinc function which is symmetrical in the x-direction.

Figure 1:
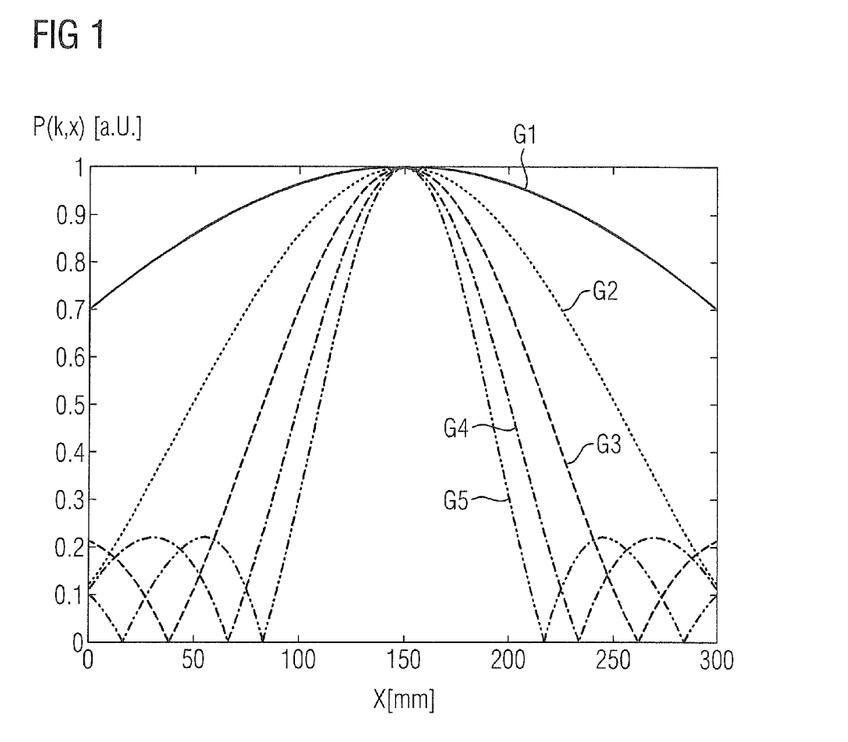
FIG. 1 illustrates the influence of the applied gradient strength on the excitation profile of an excitation pulse.

The dependency of the excitation profile in the x-direction (specified in millimeters "mm"), and therefore the produced excitation P(k,x) (specified in arbitrary units ("a.U.")) of a currently applied gradient strength G1, G2, G3, G4, G5 is presented as an example in FIG. 1. In the shown example, G5>G4>G3>G2>G1 applies. As is apparent, the excitation profile is broader the lower the applied gradient strength. The broadest excitation profile (drawn with solid line), i.e. an optimally homogeneous excitation (P(k,x)) over the largest spatial region (x), is therefore achieved at G1. The narrowest excitation profile (drawn with a double dash-dot line), which already entails a drastic change in the excitation (P(k,x)), is obtained at G5.

Mathematically, the problem can be described as follows.

In MR measurements, acquired raw MR data are entered at respective points (locations) in an organized set of data entry locations (i.e., a matrix) known as k-space F(k), which corresponds to the examination region of the subject that is to be imaged. The entry of data points into (filling of) k-space is known as scanning k-space. The relationship $$F(k)=\int f(x)e^{ikx}dx. \qquad (1)$$

applies, wherein f(x) describes the MR signal from the subject. The image I(x) is calculated via Fourier back-transformation from k-space filled with the measurement data:

$$I(x)=f(x)=\int F(k)e^{-ikx}dk. \qquad (2)$$

In the event of insufficient excitation, instead of desired k-space F(k) distorted k-space F'(k) is measured, i.e. populated with the measurement data. In distorted k-space F'(k), the signal of the examination subject f(x) is superimposed with a disturbance function P(k,x) which corresponds to the spectral form of the actual excitation pulse (thus the excitation profile):

$$F'(k)=\int f(x)P(k,x)e^{ikx}dx. \qquad (3)$$

The excitation profile P(k,x) depends both on the location x and the measured k-space point, and on the gradient strength. The excitation profile of an excitation pulse corresponds essentially to the Fourier transform of the pulse shape of the excitation pulse in time/space p(t). In the example shown using FIG. 1, the excitation profiles respectively correspond to a sin c function, for example as result of "hard" rectangular excitation pulses p(t) that have a constant value (for example B1) not equal to zero only during the duration τ of the excitation pulse:

A rectangular excitation pulse $$p(t) = \begin{cases} B1, & \text{for } |t| < \tau/2 \\ 0, & \text{otherwise.} \end{cases}$$

corresponds in the frequency domain to a sin c-shaped spectral excitation pulse P(ω) with $$P(\omega) = \frac{\sin\left(\frac{1}{2}\omega\tau\right)}{\frac{1}{2}\omega\tau} = \text{sinc}(\tfrac{1}{2}\omega\tau)$$

and a phase factor.

In the presence of switched gradients, the resonance frequency ω is a function of the location (here represented by x) in image space:

ω=2πγωG, with γ the gyromagnetic ratio and G the strength of the applied gradients. For gradients varying in the course of the MR pulse sequence (for example give various repetitions), w is also a function of the read-out k-space point k, which is why the excitation profile can also be written as P(ω)=P(k,x).

The image that is then reconstructed from distorted k-space F'(k) is a distorted MR image I'(x) that is plagued with artifacts:

$$I'(x)=\int F'(k)e^{-ikx}dk. \qquad (4)$$

According to the invention, the distorting influence of the incorrect excitation pulse can be computed out of the measured measurement data by calculating the excitation error in a disturbance matrix $D_{kx}$ and the error of the excitation is subsequently corrected by inversion of the disturbance matrix $D_{kx}$.

If Equation (3) is written as a sum (discrete values are actually measured) and the disturbance matrix $$D_{kx}=P(k,x)e^{ikx} \quad (5)$$

is defined with N×N elements (wherein N is a natural number), Equation (3) can be written in matrix form:

$$F'_k=D_{kx}f_x. \quad (6)$$

The disturbance matrix $D_{kx}$ thus reflects an excitation profile of the excitation pulse used to acquire the measurement data. The elements of Equation (5) are known and can be calculated from the form of the excitation pulse, the location x to be excited and read-out k-space point k, as well as the applied gradient G. Distorted k-space F'(k) is measured. The distorted image I(x) can therefore be calculated by matrix inversion of $D_{kx}$ and matrix multiplication with distorted k-space:

$$f_x=I_x=D_{kx}^{-1}F'_k \quad (7)$$

The calculation of a corrected image $I_x$ (x) thus is a matrix multiplication of the inverted disturbance matrix $D_{kx}^{-1}$ with the measurement data acquired in k-space $F'_k$.

Instead of a Fourier back-transformation, a matrix inversion can thus be used for the image reconstruction of a corrected image. However, the calculation of the disturbance matrix $D_{kx}$ as a whole and its subsequent inversion require an increased computing cost that requires significant computing power and also computing time. Moreover, for matrix inversion with conventional methods, the points of measurement data acquired in k-space (for example also of projections) must be arranged symmetrically around the k-space center, and the center point must correspond to the k-space center.

In both the aforementioned PETRA sequences and the aforementioned zTE sequences, due to the gradients already activated at the point in time of the excitation, the data acquisition does not begin directly in the k-space center, and no complete radial projections, but rather only what are known as radial projections, are acquired. Therefore, the k-space coordinates of the measured k-space points do not precisely coincide with the calculated values of the projections which are used to calculate the matrix; rather, they are normally displaced from these by an offset. To calculate an accurate, complete disturbance matrix, an interpolation of the data would thus be necessary. However, such interpolations are error-prone, which is why this normally leads rather to additional aliasing and artifacts in the reconstructed image which, in many cases, make a correction method based on a calculation of a complete disturbance matrix unusable.

A calculation according to the invention of individual elements of the transposed, inverted disturbance matrix from the excitation profiles used in the measurement circumvents these problems.

In a simple example, the calculation of an element of the transposed, inverted disturbance matrix $D_{xk}^{-1}$ includes an inversion of the associated excitation pulse P(k,x), namely $$\frac{1}{P(k,x)}.$$

The calculation of the elements of the transposed, inverted disturbance matrix $D_{xk}^{-1}$ additionally includes a multiplication with a phase factor $e^{-ikx}$.

A calculation according to the invention of each element of the transposed, inverted disturbance matrix $D_{xk}^{-1}$ therefore results from $$D_{xk}^{-1} = \frac{1}{P(k,x)}e^{-ikx} \quad (8)$$

for all locations x and all k-space points k, and $$D_{kx}^{-1}=(D_{xk}^{-1})^T, \quad (9)$$

with which the inverted disturbance matrix $D_{kx}^{-1}$ that is required for the calculation of the undistorted image I(x) according to Formula (1) results, by transposition of the transposed, inverted disturbance matrix $D_{xk}^{-1}$.

A magnetic resonance system according to the invention comprises a basic field magnet; a gradient field system; an RF antenna; and a control device to control the gradient field system and the RF antenna; and an image computer to receive the measurement signals received by the RF antenna, to evaluate the measurement signals and to create magnetic resonance images. The control device includes a calculation device to calculate elements of a matrix to correct artifacts in magnetic resonance images and a correction device to [sic] artifacts in magnetic resonance images which were acquired by means of an MR pulse sequence in which gradients are switched simultaneously during the radiation of at least one non-selective excitation pulse. In particular, the magnetic resonance system is designed to implement the method according to the invention as described herein.

The present invention also encompasses a non-transitory, computer-readable data storage medium encoded with programming instructions that, when the storage medium is loaded into a computerized control system of a magnetic resonance apparatus, cause the control system to operate the magnetic resonance apparatus to implement the method in accordance with the present invention, as described above.

The advantages and embodiments indicated with regard to the method apply as well to the magnetic resonance system, and the electronically readable data medium.

DESCRIPTION OF THE PREFERRED EMBODIMENTS

Figure 2:
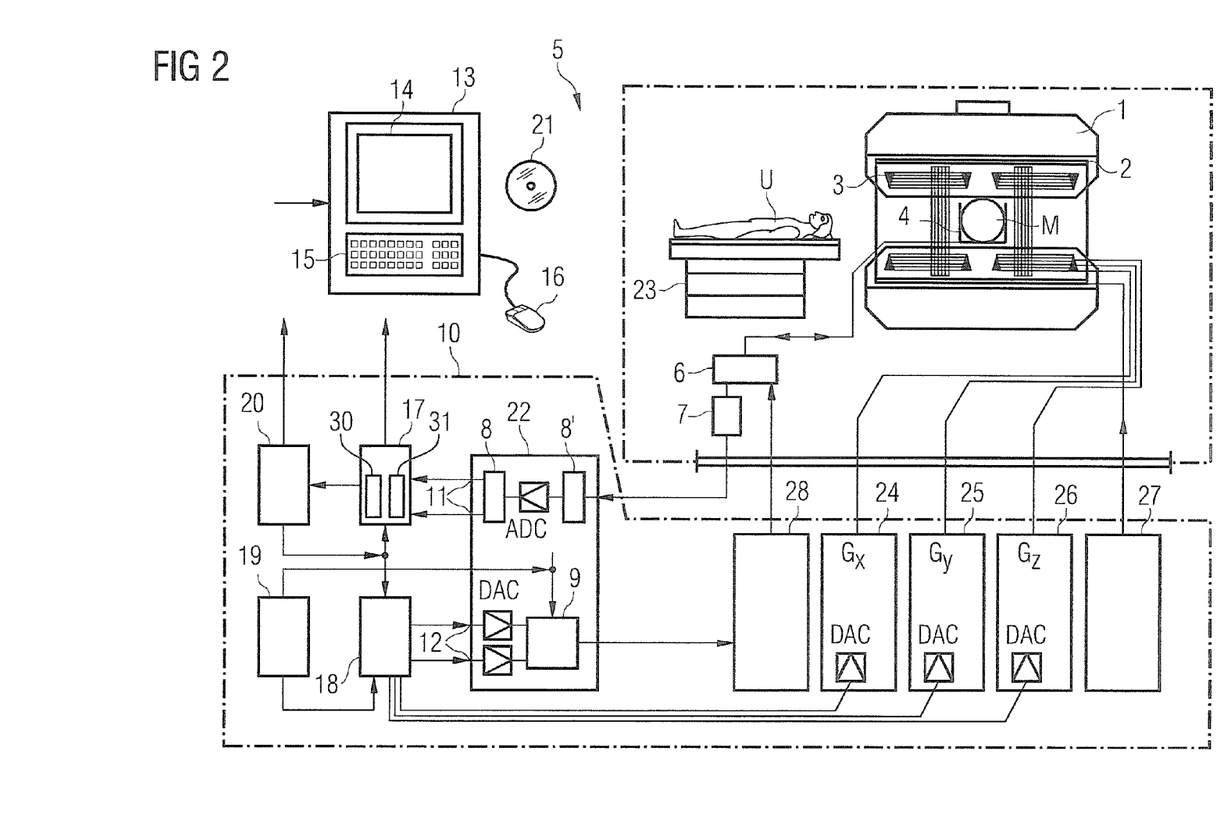
FIG. 2 schematically illustrates a magnetic resonance system according to the invention.

FIG. 2 is a schematic representation of a magnetic resonance system 5 (a magnetic resonance imaging or magnetic resonance tomography apparatus). A basic field magnet 1 generates a temporally constant, strong magnetic field for polarization or, respectively, alignment of the nuclear spins in an examination region of an examination subject U (for example a part of a human body that is to be examined) which lies on a table 23 and is slid into the magnetic resonance system 5. The high homogeneity of the basic magnetic field that is required for the nuclear magnetic resonance measurement is defined in a typically (but not necessarily) spherical measurement volume M in which are arranged the parts of the human body that are to be examined. To support the homogeneity requirements, and in particular to eliminate temporally invariable influences, what are known as shim plates made of ferromagnetic material are mounted at a suitable location. Temporally variable influences are eliminated by shim coils 2 and a suitable activation 27 for the shim coils 2.

In the basic field magnet 1, a cylindrical gradient coil system 3 is used that has three sub-windings. Each sub-winding is supplied by a corresponding amplifier 24-26 with current to generate a linear gradient field in the respective direction of the Cartesian coordinate system. The first sub-winding of the gradient field system 3 thereby generates a gradient $G_x$ in the x-direction; the second sub-winding generates a gradient $G_y$ in the y-direction; and the third sub-winding generates a gradient $G_z$ in the z-direction. Each of the amplifiers 24-26 has a digital/analog converter (DAC) that is controlled by a sequence controller 18 for time-accurate generation of gradient pulses.

Located within the gradient field system 3 is a radio-frequency antennas 4 which converts the radio-frequency pulses emitted by a radio-frequency power amplifier into an alternating magnetic field for excitation of the nuclei and alignment of the nuclear spins of the subject to be examined or, respectively, of the region of the subject that is to be examined. The radio-frequency antenna 4 comprises one or more RF transmission coils and one or more RF reception coils in the form of an arrangement (for example annular, linear or matrix-like) of component coils. The alternating field emanating from the precessing nuclear spins—i.e. normally the spin echo signals caused by a pulse sequence made up of one or more radio-frequency pulses and one or more gradient pulses—is also converted by the RF reception coils of the radio-frequency antenna 4 into a voltage (measurement signal) which is supplied via an amplifier 7 to a radio-frequency reception channel 8, 8' of a radio-frequency system 22. The radio-frequency system 22 furthermore has a transmission channel 9 in which the radio-frequency pulses are generated for the excitation of the magnetic resonance signals. The respective radio-frequency pulses are digitally represented in the sequence controller 18 as a series of complex numbers based on a pulse sequence predetermined by the system computer 20. This number sequence is supplied as a real part and imaginary part to a digital/analog converter (DAC) in the radio-frequency system 22 via respective inputs 12, and from said digital/analog converter to the transmission channel 9. In the transmission channel 9, the pulse sequences are modulated on a radio-frequency carrier signal whose base frequency corresponds to the center frequency. The modulated pulse sequences are supplied via an amplifier 28 to the RF transmission coil of the radio-frequency antenna 4.

The switching from transmission operation to reception operation takes place via a transmission/reception diplexer 6. The RF transmission coil of the radio-frequency antenna 4 radiates the radio-frequency pulses for excitation of the nuclear spins into the measurement volume M and scans resulting echo signals via the RF reception coils. The acquired magnetic resonance signals are phase-sensitively demodulated to an intermediate frequency in a first demodulator 8' of the reception channel of the radio-frequency system 22 and digitized in an analog/digital converter (ADC). This signal is further demodulated to a frequency of 0. The demodulation to a frequency of 0 and the separation into real part and imaginary part occur in a second demodulator 8 after the digitization in the digital domain, which second demodulator 8 outputs the demodulated data via outputs 11 to an image computer 17. An MR image is reconstructed by the image computer 17 from the measurement data acquired in such a manner, in particular using the method according to the invention, for which the control unit 10 has, for example, a calculation device 31 for the calculation according to the invention of elements of a matrix to correct artifacts in magnetic resonance images and a correction device 30 to correct artifacts in magnetic resonance images which were acquired by means of an MR pulse sequence in which gradients are switched simultaneous during the radiation of at least one non-selective excitation pulse. This calculation device 31 and/or the correction device 30 are, for example, comprised by the image computer 17. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 thereby controls the time-accurate switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an acquisition of measurement data (which control programs are stored on a DVD 21, for example), as well as other inputs on the part of the user and the presentation of the generated MR image, take place via a terminal 13 which comprises input means—for example a keyboard 15 and/or a mouse 16—to enable an input and display means—for example a monitor 14—to enable a display.

Figure 3:
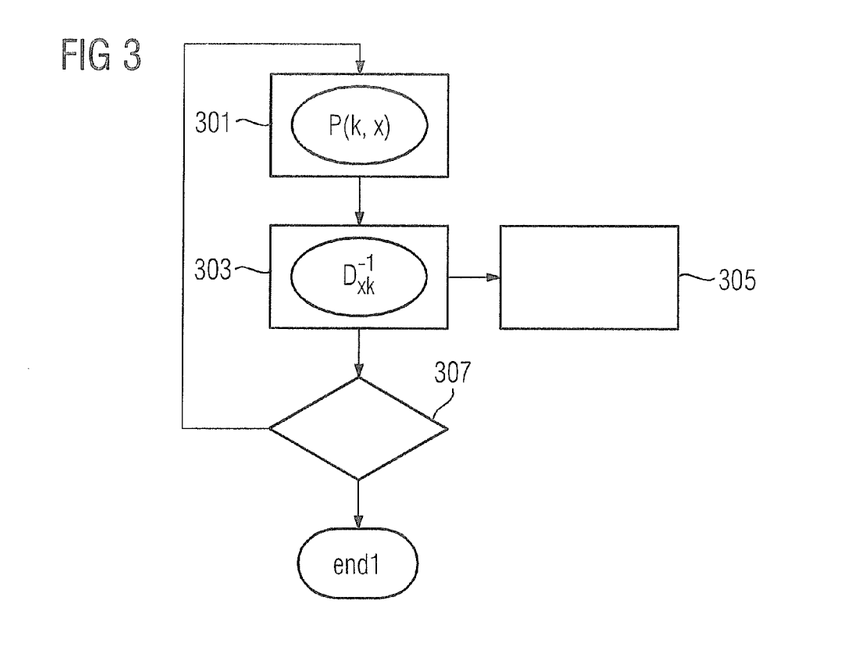
FIG. 3 is a flowchart of an embodiment of a method according to the invention for the calculation of individual elements of a matrix for correction of artifacts in magnetic resonance images.

FIG. 3 shows a flowchart of a method according to the invention for the calculation of individual elements of a matrix to correct artifacts in magnetic resonance images which are reconstructed from measurement data which were acquired by means of an MR pulse sequence in which gradients are switched simultaneously during the radiation of at least one non-selective excitation pulse.

In a Step 301, an excitation profile P(k,x) of an excitation pulse used to acquire the measurement data is thereby loaded. As described above, such an excitation profile P(k,x) depends on the measured location x and the measured k-space point k and the gradient strength applied in the measurement.

In a further Step 303, an element of an inverted disturbance matrix $D_{xk}^{-1}$ is calculated from the loaded excitation profile P(k,x), which element corresponds to the loaded excitation profile P(k,x) at location x and measured k-space point k.

The calculated element of the inverted disturbance matrix $D_{xk}^{-1}$ thus corresponds to an element of the matrix $D_{xk}^{-1}$ for correction of artifacts in magnetic resonance images which are reconstructed from measurement data which were acquired by means of an MR pulse sequence in which gradients are switched simultaneously during the radiation of at least one non-selective excitation pulse. In a further Step 305, the calculated element $D_{xk}^{-1}$ can be stored for further processing.

Via a query 307, it can be determined whether all desired elements of [the] inverted disturbance matrix have already been calculated, or whether additional elements of the inverted disturbance matrix should still be calculated. If the calculation of additional elements of the inverted disturbance matrix is desired, the method begins again at Step 301, possibly with specification of the desired parameters x and k. If no further element of the inverted disturbance matrix should be calculated anymore, the method ends ("end1").

As noted above, the calculation of an element of the inverted disturbance matrix $D_{xk}^{-1}$ in particular includes an inversion of the associated excitation pulse P(k,x) and a multiplication with a phase factor $e^{-ikx}$.

With the method according to the invention it is thus possible to calculate individual elements $D_{xk}^{-1}$ of the inverted disturbance matrix without needing to previously calculate the entire (original) disturbance matrix $D_{kx}$. With the inversion method according to the invention it is additionally possible to also correct points that were measured in an asymmetrical projection.

Figure 4:
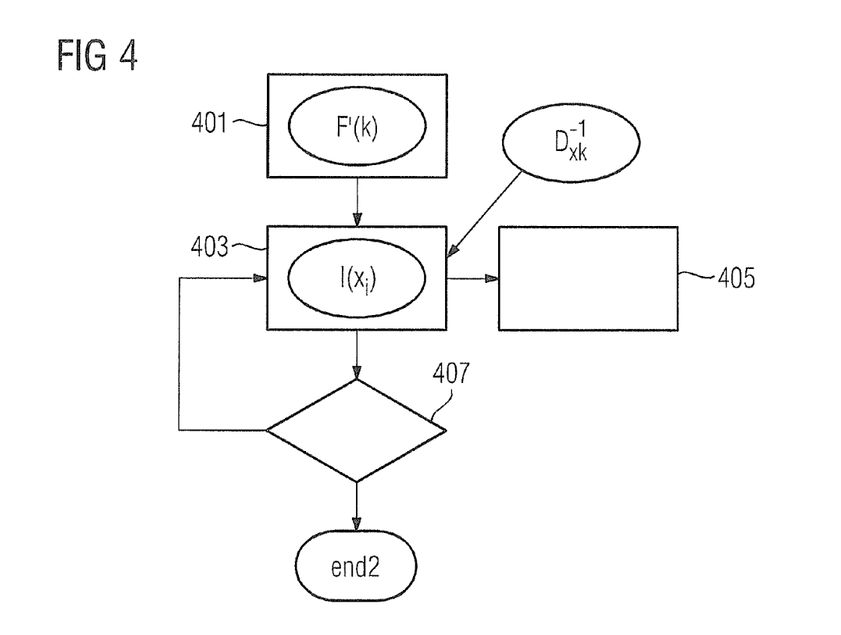
FIG. 4 is a flowchart of an embodiment of a method to correct artifacts in magnetic resonance images using elements, calculated according to the invention, of a matrix for correction of artifacts in magnetic resonance images.

Shown in FIG. 4 is a schematic workflow diagram of a method for correction of artifacts in magnetic resonance images which were acquired by means of an MR pulse sequence, in which gradients are switched simultaneously during the radiation of at least one non-selective excitation pulse, using elements (calculated according to the invention) of a matrix for correction of artifacts in magnetic resonance images.

In Step 401, measurement data acquired with the MR pulse sequence are loaded into k-space F'(k).

In a further Step 403, a corrected image I(x) is calculated from the acquired measurement data in k-space F'(k) and the associated elements of the inverted disturbance matrix $D_{xk}^{-1}$ that are calculated according to a method according to the invention (according to FIG. 3, for example). In particular, the method in particular proceeds as already described above according to Formula (7), wherein in matrix notation F'(k) corresponds to $F_k'$ and I(x) corresponds to $I_x$, and $D_{xk}^{-1}$ must still be transposed into $D_{kx}^{-1}$.

For example, the corrected image I(x) can be stored and/or displayed (Block 405).

In one exemplary embodiment, the calculation of the corrected image I(x) takes place per pixel, meaning that calculation takes place initially for each location x of the associated pixel $I(x_i)$ (with $x_i$ equal to a specific measured location x) from the acquired measurement data in k-space F'(x) and the associated element of the inverted disturbance matrix $D_{xk}^{-1}$ (with $x=x_i$) calculated according to a method according to the invention (for example according to FIG. 3). The calculation of the required associated element $D_{xk}^{-1}$ of the inverted disturbance matrix (with $x=x_i$) can thereby also first be included via the calculation of this pixel $I(x_i)$ and does not need to already take place beforehand. The elements of the inverted disturbance matrix $D_{xk}^{-1}$ that are calculated according to the invention can thus also first be calculated during the matrix multiplication to obtain the corrected image I(x) or to obtain portions (pixels) of the corrected $I(x_1)$ according to Formula (7), with which the correction can be very effectively designed. For example, a long storage of the elements of the disturbance matrix can thus be foregone.

For example, if the corrected image I(x) is calculated per pixel, a check is made (via a query 407, for example) as to whether all desired pixels $I(x_i)$ have already been calculated. If all desired pixels $I(x_i)$ have not yet been calculated, in Block 403 an additional pixel $I(x_j)$ (with $i \neq j$) is calculated again and stored (Block 405). If all desired pixels can be calculated from these, the corrected image I(x) can be composed and the method ends ("end2").

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating a matrix to correct artifacts in a magnetic resonance image, said magnetic resonance image being reconstructed from measurement data acquired using a magnetic resonance pulse sequence that comprises activating at least one magnetic field gradient, having a gradient field strength, during radiation of at least one non-selective radio frequency excitation pulse said measurement data being entered into k-space at respective points in k-space, said method comprising:
    loading an excitation profile into a processor for each excitation pulse used to acquire said magnetic resonance measurement data, said excitation profile representing said gradient field strength as a function of a measurement location at which said measurement data were acquired, and the point in k-space at which said measurement data are entered; and
    in said processor, from each loaded excitation profile, calculating an element of a transposed, inverted disturbance matrix that corresponds to said location and said k-space point, and making said transposed, inverted disturbance matrix available in electronic form at an output of said processor in a format allowing operation of said transposed, inverted disturbance matrix on said magnetic resonance measurement data to correct artifacts in said magnetic resonance image.

2. A method as claimed in claim 1 comprising calculating each element of the transposed, inverted disturbance matrix by inverting the excitation profile associated with the respective element.

3. A method as claimed in claim 2 comprising calculating each element of said transposed, inverted disturbance matrix by multiplying said inverted excitation profile with a phase factor.

4. A method to correct artifacts in a magnetic resonance image, comprising:
    loading magnetic resonance measurement data into a processor acquired with a magnetic resonance pulse sequence in which at least one gradient magnetic field, having a gradient field strength, was activated during radiation of at least one non-selective radio frequency excitation pulse, with said magnetic resonance measurement data being entered into k-space at respective points in k-space;
    loading an excitation profile into said processor for each excitation pulse used to acquire said magnetic resonance measurement data, said excitation profile representing said gradient field strength as a function of a measurement location of said magnetic resonance measurement data and the point in k-space at which said magnetic resonance measurement data were entered;
    in said processor, for each excitation profile, calculating an element of a transposed, inverted disturbance matrix that corresponds to said location and said point in k-space;
    in said processor, applying said transposed, inverted disturbance matrix to the acquired magnetic resonance measurement data in k-space in order to generate a corrected image; and
    making said corrected image available at an output of said processor in electronic form, as a data file.

5. A method as claimed in claim 4 wherein said corrected image is comprised of pixels, and comprising calculating said corrected image pixel-by-pixel, with one of said elements of said transposed, inverted disturbance matrix respectively corresponding to each of said pixels.

6. A magnetic resonance apparatus comprising:
a magnetic resonance data acquisition unit comprising a radio frequency antenna system and a gradient coil system;
a control unit configured to operate said data acquisition unit with a magnetic resonance pulse sequence that causes at least one gradient magnetic field, having a gradient field strength, to be activated by said gradient coil system during radiation of at least one non-selective radio frequency excitation pulse by said radio frequency antenna system, to acquire magnetic resonance measurement data that is entered into k-space at respective points in k-space;
a processor loaded with an excitation profile for each excitation pulse used to acquire said magnetic resonance measurement data, said excitation profile representing said gradient field strength as a function of a measurement location of said magnetic resonance measurement data and the point in k-space at which said magnetic resonance measurement data were entered;
said processor being configured, for each excitation profile, to calculate an element of a transposed, inverted disturbance matrix that corresponds to said location and said point in k-space;
said processor being configured to apply said transposed, inverted disturbance matrix to the acquired magnetic resonance measurement data in k-space in order to generate a corrected image; and
said processor being configured to make said corrected image available at an output of said processor in electronic form, as a data file.

7. A non-transitory, computer-readable data storage medium encoded with programming instructions, said storage medium being loaded into a computerized processor and said programming instructions causing said computerized processor to:
receive an excitation profile into the processor for each excitation pulse used to acquire said magnetic resonance measurement data, acquired with a magnetic resonance pulse sequence in which at least one gradient magnetic field, having a gradient field strength, was activated during radiation of at least one non-selective radio frequency excitation pulse, with said magnetic resonance measurement data being entered into k-space at respective points in k-space, said excitation profile representing said gradient field strength as a function of a measurement location at which said measurement data were acquired, and the point in k-space at which said measurement data are entered; and
from each loaded excitation profile, calculate an element of a transposed, inverted disturbance matrix that corresponds to said location and said k-space point, and make said transposed, inverted disturbance matrix available in electronic form at an output of said processor in a format allowing operation of said transposed, inverted disturbance matrix on said magnetic resonance image to correct artifacts in said magnetic resonance image.

8. A non-transitory, computer-readable data storage medium encoded with programming instructions, said storage medium being loaded into a computerized processor and said programming instructions causing said computerized processor to:
receive magnetic resonance measurement data into said processor acquired with a magnetic resonance pulse sequence in which at least one gradient magnetic field, having a gradient field strength, was activated during radiation of at least one non-selective radio frequency excitation pulse, with said magnetic resonance measurement data being entered into k-space at respective points in k-space;
receive an excitation profile into said processor for each excitation pulse used to acquire said magnetic resonance measurement data, said excitation profile representing said gradient field strength as a function of a measurement location of said magnetic resonance measurement data and the point in k-space at which said magnetic resonance measurement data were entered;
for each excitation profile, calculate an element of a transposed, inverted disturbance matrix that corresponds to said location and said point in k-space;
apply said transposed, inverted disturbance matrix to the acquired magnetic resonance measurement data in k-space in order to generate a corrected image; and
make said corrected image available at an output of said processor in electronic form, as a data file.

* * * * *